United States Patent
Reed et al.

(10) Patent No.: US 9,206,999 B2
(45) Date of Patent: Dec. 8, 2015

(54) BEARING FOR SOLAR PANEL TRACKING SYSTEM

(71) Applicant: JSI Equipment Solutions LLC, Boulder, CO (US)

(72) Inventors: Max W. Reed, Longmont, CO (US); Brian D. Kirtland, Boulder, CO (US)

(73) Assignee: JSI Equipment Solutions LLC, Boulder, CO (US)

( * ) Notice: Subject to any disclaimer, the term of this patent is extended or adjusted under 35 U.S.C. 154(b) by 177 days.

(21) Appl. No.: 14/013,835

(22) Filed: Aug. 29, 2013

(65) Prior Publication Data

US 2015/0059826 A1   Mar. 5, 2015

(51) Int. Cl.
 *F24J 2/52* (2006.01)
 *F24J 2/54* (2006.01)
 *H01L 31/18* (2006.01)

(52) U.S. Cl.
 CPC ........ *F24J 2/5264* (2013.01); *F24J 2/52* (2013.01); *F24J 2002/5482* (2013.01); *H01L 31/18* (2013.01)

(58) Field of Classification Search
 CPC ..... H01L 31/042; H01L 31/05; H01L 31/048; Y02E 10/47; Y02E 10/50
 USPC .......... 136/244; 248/691, 511, 574, 583, 913, 248/351, 354.4, 354.7, 354.5, 207, 220.2, 248/220.22, 220.42, 220.14, 222.52
 See application file for complete search history.

(56) References Cited

U.S. PATENT DOCUMENTS

| | | | | |
|---|---|---|---|---|
| 1,810,229 | A * | 6/1931 | Stirrup | 248/222.52 |
| 3,967,083 | A * | 6/1976 | Bould et al. | 200/237 |
| 6,929,226 | B1 * | 8/2005 | Philistine | 248/222.52 |
| 7,647,924 | B2 | 1/2010 | Hayden | |
| 2011/0240006 | A1 | 10/2011 | Linke et al. | |
| 2011/0253195 | A1 | 10/2011 | Kim | |
| 2012/0073563 | A1 | 3/2012 | Zuritis | |
| 2012/0180845 | A1 * | 7/2012 | Cole et al. | 136/246 |
| 2012/0216851 | A1 | 8/2012 | Jang | |
| 2012/0216852 | A1 | 8/2012 | Almy | |
| 2012/0219243 | A1 | 8/2012 | Jang | |
| 2013/0039610 | A1 | 2/2013 | Schneider et al. | |

FOREIGN PATENT DOCUMENTS

EP   2317247 A2   5/2011

* cited by examiner

*Primary Examiner* — Jeffrey T Barton
*Assistant Examiner* — Daniel Malley, Jr.
(74) *Attorney, Agent, or Firm* — Bracewell & Giuliani LLP

(57) ABSTRACT

A solar panel array system has posts for mounting vertically in earth along a Z-axis. A torque tube extends along an X-axis at upper ends of the posts for supporting and pivoting solar panels to track the sun. A bearing saddle base has a downward-facing surface that is placed on an upward-facing surface of the post. Lugs and slots on the upward-facing and downward-facing surfaces are positioned so that rotating the base about the Z-axis causes the lugs to enter the slots. A bearing saddle cradle is adjustably mounted to the base at selected pitch angles relative to the base. The base is rotatable about the Z-axis to various positions either centered or placing the X-axis at a yaw angle relative to the post.

20 Claims, 8 Drawing Sheets

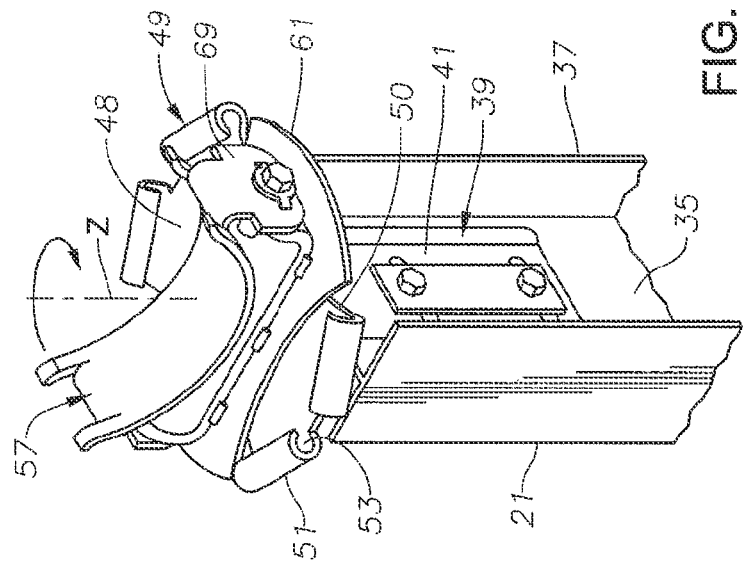
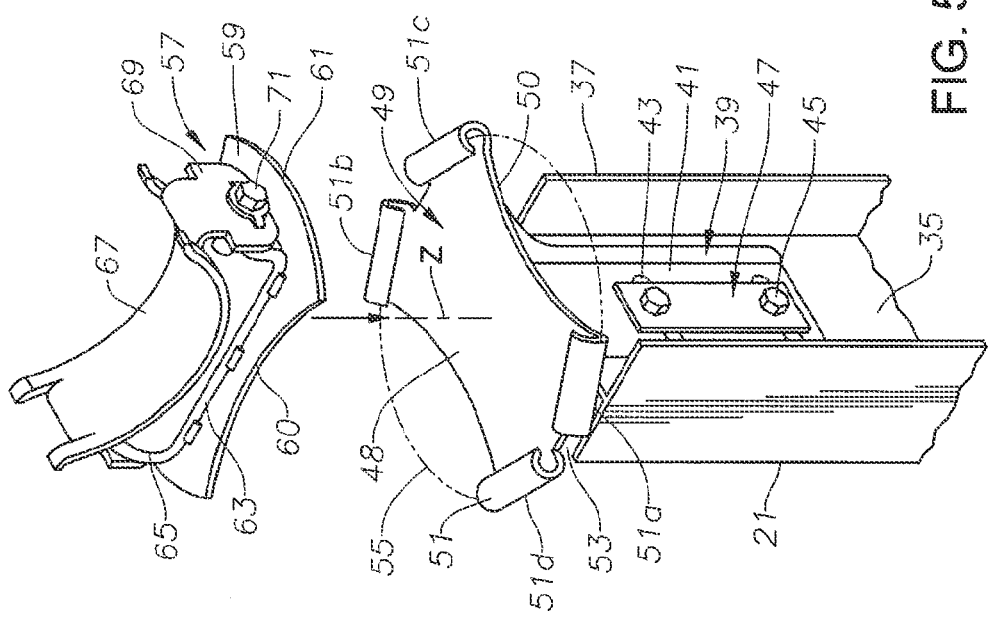

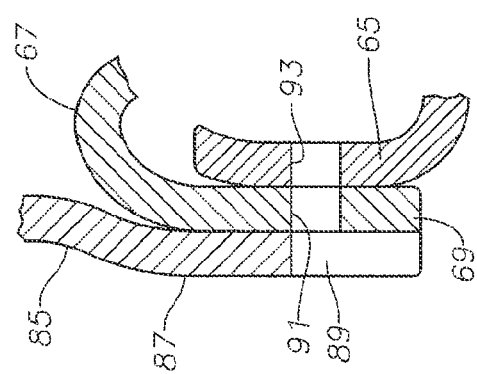
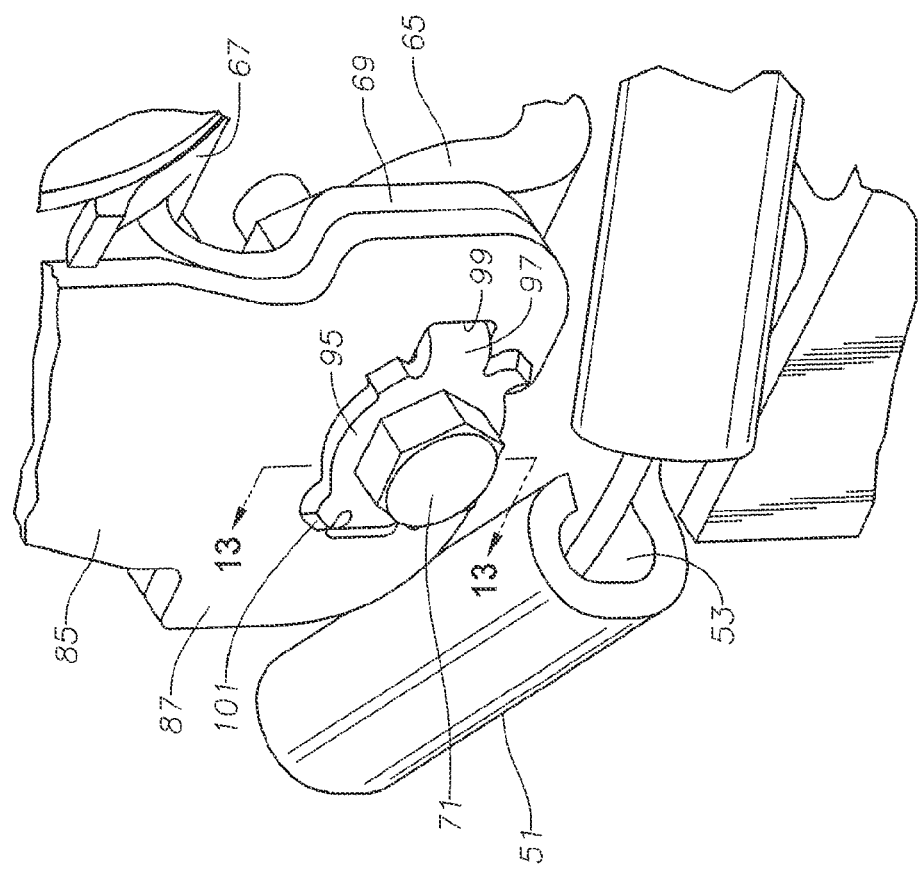

BEARING FOR SOLAR PANEL TRACKING SYSTEM

FIELD OF THE DISCLOSURE

This invention relates in general to bearings for a solar or photo-voltaic panel system that tracks the sun.

BACKGROUND

Solar or photo-voltaic panels may be installed with a tracking system to pivot and track the sun during the day. One type of system has parallel rows of panels, each row extending north and south. The panels row are mounted on a torque or torsion tube for rotation with the tube. Each row has a separate torque tube. A drive shaft extends perpendicular to the torque tubes and has mechanical devices that convert movement of the drive shaft into rotation of the torque tube. A controller programmed to track the sun operates the drive shaft.

The torque tube is supported on several posts, each of which has a bearing on its upper end. A variety of bearings are in use and have been proposed. While workable, improvements are desirable.

SUMMARY

The bearing of this disclosure has a lower bracket having a post mounting plate with apertures to receive fasteners to mount to a vertical post. The lower bracket has a bearing mount on an upper end of the post mounting plate. A bearing insert is rotatably positioned on a bearing saddle. The bearing insert has a cavity for receiving and rotating with the torque tube. A twist-lock arrangement between the bearing saddle and the bearing mount secures the bearing saddle to the bearing in response to incremental rotation of the bearing saddle relative to the bearing mount.

Preferably, the twist-lock arrangement includes slots on either the bearing mount or the bearing saddle. The slots are spaced about a Z-axis of the bearing mount. Lugs on the other component slide into engagement with the slots in response to rotation of the bearing saddle about the Z-axis relative to the bearing mount. The lugs and slots define a centered retaining position that retains the bearing saddle on the bearing mount against movement along the Z-axis, and which centers the bearing saddle on the bearing mount. The bearing saddle is free to rotate either clockwise or counterclockwise from the centered retaining position to a yaw angle position wherein an X-axis of the cavity in the bearing passes through a plane of the mounting plate at a yaw angle. In one embodiment, the slots are on the bearing mount and the lugs on the bearing saddle.

The bearing saddle may have a base and a partially cylindrical cradle mounted to the base by fasteners. The bearing insert is positioned on the cradle. The cradle is adjustable relative to the base to set a pitch angle relative to the Z-axis for an X-axis of the cavity of the bearing insert.

The bearing insert may have a segment that is positioned on the cradle and another segment adapted to extend over the torque tube. A clamp or strap fits over the bearing insert and has strap tabs on each end. The strap tabs have holes that register with the holes of the base tabs and the cradle tabs. Fasteners extend through the aligned holes of the base tabs, cradle tabs and clamp tabs to secure the strap to the cradle and the cradle to the base while the cradle is at the selected pitch angle.

The twist-lock arrangement may include at least two rolls integrally formed on opposite edges of either the bearing mount or the bearing saddle. The rolls have lips spaced to define slots. The lugs slide into the slots during rotation of the bearing saddle about the Z-axis relative to the bearing mount.

BRIEF DESCRIPTION OF THE DRAWINGS

FIG. 5 is an exploded perspective view of a lower bracket and a bearing saddle for one of the bearings of FIG. 1.

FIG. 6 is a perspective view showing the bearing saddle of FIG. 5 being placed on the lower bracket, prior to rotating the bearing saddle to secure it to the lower bracket.

FIG. 12 is an enlarged perspective view illustrating one of the strap ends of FIG. 11 secured to the bearing saddle.

FIG. 13 is a sectional view of the strap end and bearing saddle tabs along the line 13-13 of FIG. 12 with the fastener removed.

DETAILED DESCRIPTION OF THE DISCLOSURE

Figure 1:
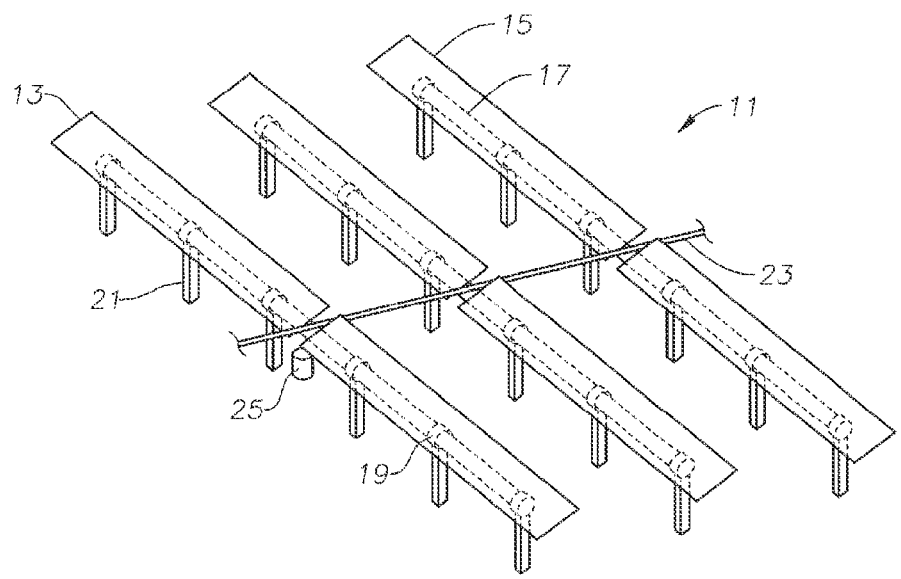
FIG. 1 is a schematic illustration of a photo-voltaic panel tracking system having bearings in accordance with this disclosure.

Referring to FIG. 1, solar array system 11 is of a type having the ability to track the sun during the day. Solar array system 11 has several parallel rows 13 (three shown) aligned in a north-south direction. In each row, solar panels 15, also called photo-voltaic panels, are mounted on a torque tube 17, which extends in a north-south direction. Each torque tube 17 may extend from one end to the other end of one of the rows 13, or each torque tube 17 may have sections coupled together with flexible joints or field-welded to each other. Torque tubes 17 rotate incrementally, causing solar panels 15 to tilt and remain in better exposure to the sun.

Torque tubes 17 are mounted by bearings 19 to vertical posts 21. Posts 21 are embedded in the earth or a provided foundation at selected distances apart from each other. A drive shaft 23 driven by a drive unit 25 extends perpendicular to rows 13 and engages each torque tube 17 to cause pivotal rotation of each torque tube. Drive shaft 23 may rotate or may move linearly. Drive shaft 23 is illustrated as engaging torque tubes 17 midway along the lengths of each row 13. Each torque tube 17, may for example be 200 feet in length or more, and posts 21 may be about 18 feet apart from each other.

Figure 2:
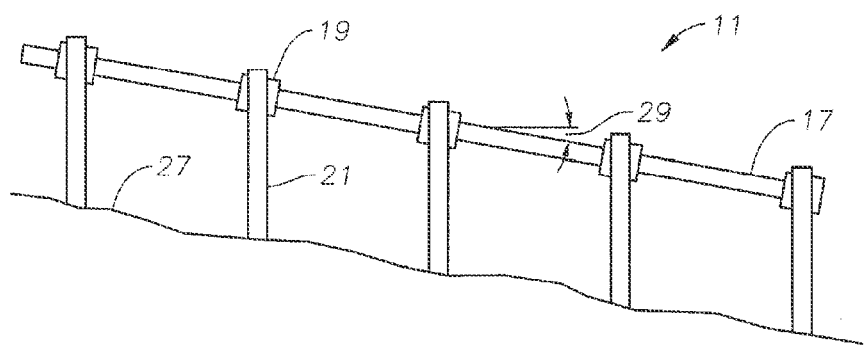
FIG. 2 is a schematic side view of part of the tracking system of FIG. 1 illustrated on inclined terrain.

Referring to FIG. 2, earth terrain 27 on which solar array system 11 is mounted may be inclined relative to horizontal and may have depressions and rises. Posts 21 are preferably installed vertically even if terrain 27 is irregular. Also, preferably bearings 19 are all approximately the same distance from terrain 27. Bearings 19 are adjustable so as to account for torque tube 17 being inclined relative to horizontal.

Figure 3:
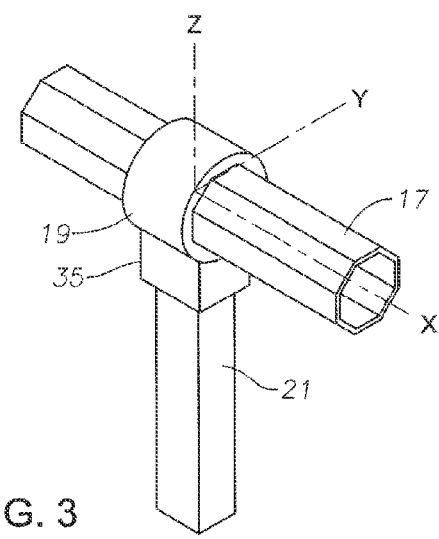
FIG. 3 is a schematic perspective view of one of the bearings of the tracking system of FIG. 1.
Figure 4:
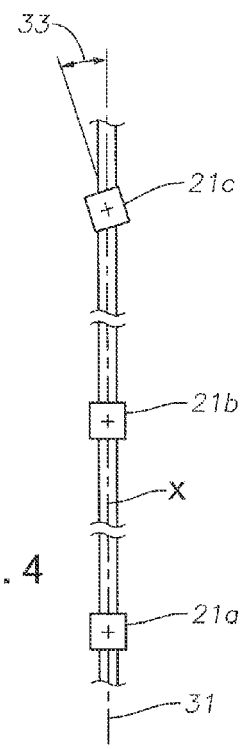
FIG. 4 is a schematic top view of one of the torque tubes extending along three of the posts of the solar array system of FIG. 1.

Referring also to FIGS. 3 and 4, a Z-axis for each post 21 is normally always vertical. The X-axis is the axis of rotation of torque tube 17, and it will be horizontal and intersect the Z-axis perpendicular to the Z-axis if terrain 27 is horizontal and posts 21 are perfectly aligned in a straight line. The X-axis will be inclined relative to the Z-axis at a pitch angle 29 (FIG. 2) other than 90 degrees if terrain 27 is inclined, as shown.

A Y-axis extends laterally from and is perpendicular to the Z-axis and the X-axis. The Y-axis is in a vertical plane containing the Z-axis and which is orthogonal to a vertical plane containing the X-axis. Variations in location and orientation can occur when installing posts 21. For smooth operation, bearings must provide coaxial alignment. As illustrated in the exaggerated schematic of FIG. 4, a post 21c is twisted or misaligned relative to posts 21a, 21b, such that the Y-axis of post 21c is not in a plane parallel with the planes of the Y-axis of post 21a and post 21b. Post 21c faces at a yaw angle 33 relative to a straight line 31 normal to the faces of posts 21a, 21b. Each bearing 19 must be aligned in Y, Z, yaw and pitch to achieve coaxial alignment with straight line 31. Bearings 19 are configured to accommodate both a pitch angle 29 other than 90 degrees as well as a yaw angle 33 other than zero.

Referring to FIG. 5, post 21 is illustrated as having a wide flange I-shape, having a flat post face or web 35 and flanges 37 on each edge. Other configurations are feasible. A plane parallel to face 35 will contain the Z-axis and the Y-axis. If pitch angle 29 (FIG. 2) is 90 degrees and yaw angle 33 (FIG. 4) zero, the X-axis will be normal to the plane containing face 35. A lower bracket 39 secures to the upper portion of post face 35. Lower bracket 39 has a post mounting plate 41 that is flat and fits flush against face 35. Post mounting plate 41 has horizontal elongated apertures 43 that align with vertical elongated apertures (not shown) in post face 35. Fasteners 45 extend through a backing plate 47 and through horizontal apertures 43 and the vertical apertures in face 35. Nuts (not shown) on the opposite side of post 21 secure fasteners 45. Horizontal apertures 43 and the vertical apertures in post face 35 allow lower bracket 39 to be adjusted both in the Z-axis direction and the Y-axis direction. If post 21 is tilted, so that face 35 is not vertical, lower bracket 39 can be tilted such that its upward-facing surface 48 is in a horizontal plane. The combination of horizontal apertures 43 and vertical apertures (not shown) allow bracket 39 to tilt.

Lower bracket 39 has a bearing mount 49 formed or welded to its upper end. Bearing mount 49 has an upward-facing surface 48 that is normal to the Z-axis. Upward-facing surface 48 is preferably flat and optionally may have two concave edge portions 50 on opposite sides. Alternately, concave edge portions 50 could be convex, straight, or other contours. Four rolls 51 are illustrated as being formed on portions of the periphery of bearing mount 49 other than concave edge portions 50. Two of the rolls 51a, 51d are illustrated on a portion of the periphery opposite the other two rolls 51b, 51c. Each roll 51 is bent upward and over upward-facing surface 48, with a lip of each roll 51 spaced slightly above upward-facing surface 48 to define a slot 53. In this example, each roll 51 is formed along a straight line that is tangent to a phantom circle 55 concentric with the Z-axis. Circle 55 passes through all of the slots 53. Rolls 51a and 51b are parallel to each other, and rolls 51c and 51d are parallel to each other, with a slight gap located between. Rolls 51b and 51c are closely spaced to each other, and rolls 51a, 51d are closely spaced to each other, with a slight gap located between. The circumferential distance along circle 55 from roll 51a to roll 51c or from roll 51d to roll 51b is much farther than the gap between rolls 51b and 51c and the gap between rolls 51a and 51d.

A bearing saddle 57 is illustrated positioned above and prior to installation on bearing mount 49. Bearing saddle 57 has a base 59 with a downward-facing surface that is also preferably flat for overlying bearing mount upward-facing surface 48 in flush, parallel contact. Base 59 has a peripheral edge with two concave portions 60 that have the same contour and dimensions as bearing mount concave edge portions 50. Base 59 has two lugs 61 opposite each other relative to the Z-axis. Each lug 61 is a partially circular edge extending from one concave edge portion 60 to the other. The diameter measured from one lug 61 to the other is approximately the same as the diameter of phantom circle 55. The curvature of each lug 61 is the same as phantom circle 55. The thickness of each lug 61 is slightly less than the vertical thickness of each roll slot 53 so that lugs 61 can rotate freely in slots 53.

Figure 7:
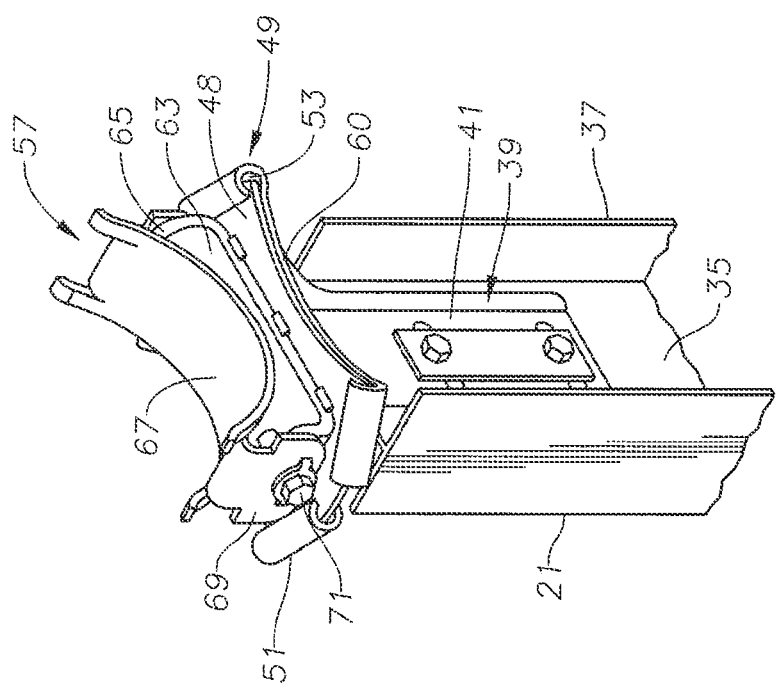
FIG. 7 is a perspective view showing the bearing saddle of FIG. 5 rotated and secured to the lower bracket in a centered position.

As illustrated in FIGS. 6 and 7, after placing base 59 on upward-facing surface 48, a worker twists or rotates base 59 relative to bearing mount 49 less than one turn, causing lugs 61 to enter slots 53. If rotated clockwise, as illustrated, one lug 61 initially slides into the entry of slot 53 of roll 51a while the other slides into slot 53 of roll 51b. Once lugs 61 enter slots 53 of rolls 51a and 51b, base 59 is in an initial retaining position that prevents base 59 from moving along the Z-axis. The worker is free to continue twisting base 59 past the initial retaining position, which causes lugs 59 to now enter slots 53 of rolls 51c, 51d. FIG. 7 shows base 59 rotated to a centered position wherein one-half of each lug 59 is located within two of the rolls 51. In this position, a center point of each base concave edge portion 60 will be aligned with a vertical centerline of post mounting plate 41. Preferably, there is no stop that prevents base 59 from moving from the centered position of FIG. 7 in either clockwise or counterclockwise directions.

Referring still to FIGS. 5-7, bearing saddle 57 also includes a cradle support 63 mounted, such as by spot welding, to upward-facing surface 48. Cradle support 63 is a generally U-shaped member with a flat central portion in abutment with upward-facing surface 48. Base tabs 65 extend upward from the flat central portion at opposite ends and are generally parallel with each other.

A cradle 67 attaches to cradle support 63. Cradle 67 has an upward-facing curvilinear or partially cylindrical surface that extends circumferentially less than 180 degrees. Downward extending cradle tabs 69 are formed at each end of cradle 67. Cradle tabs 69 are generally parallel with each other and configured to slide in contact with and on the outer sides of base tabs 65. Fasteners 71 secures cradle tabs 69 to base tabs 65. Cradle 67 can be horizontally mounted on base 59, as shown in FIG. 7, or adjusted to inclined orientations relative to base 59 to accommodate pitch changes, as will be explained in more detail below.

Figure 8:
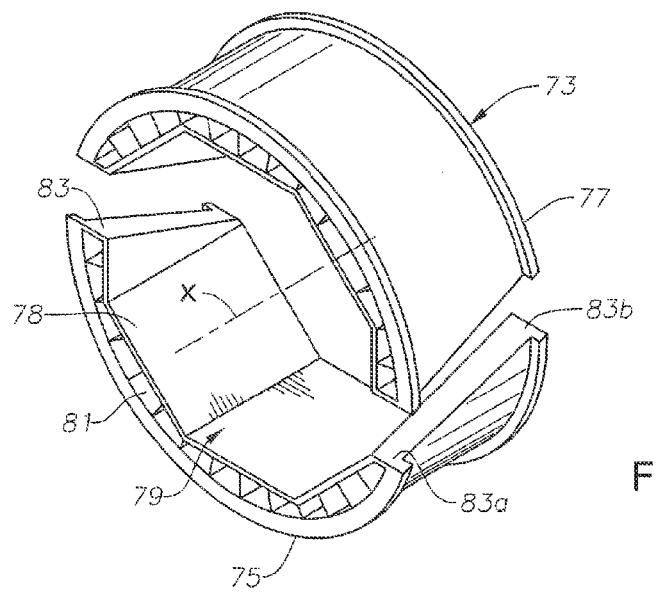
FIG. 8 is a perspective view of a bearing insert of one of the bearings of FIG. 1.
Figure 10:
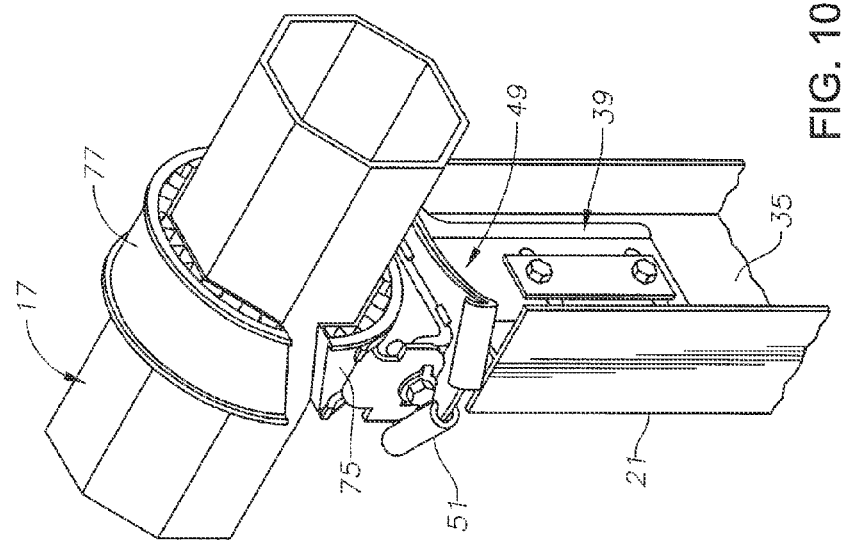
FIG. 10 is a perspective view of one of the torque tubes of the system of FIG. 1 placed on the segment of the bearing insert of FIG. 8, and another segment of the bearing insert of FIG. 8 placed on top of the torque tube.

Referring to FIG. 8, a bearing insert 73, preferably of a low friction polymeric material, has a first arcuate segment 75 and a second arcuate segment 77. Each segment 75, 77 has a partially cylindrical outer surface, preferably less than 180 degrees, and each is preferably a single-piece injection molded member. Each segment 75, 77 has polygonal drive surfaces 78 formed therein, defining a drive receptacle or cavity 79 for torque tube 17 (FIG. 10). Cavity 79 has a center that coincides with the torque tube X-axis. Drive surfaces 78 may be flat or configured otherwise. Drive surfaces 78 may define an octagonal shape, as shown, a square shape, a D-ring shape, or other shapes. Bearing insert 73 may have a truss structure 81 formed between its outer cylindrical surface and its inner drive surfaces 78. Truss structure 81 provides voids to reduce the amount of material required for each segment 75, 77.

In the example shown, each segment 75, 77 has end edges 83 at opposite ends. Preferably each end edge 83 is inclined relative to the X-axis, rather than being parallel. Also, end edges 83 incline in opposite directions to each other, assuring that a worker would not by mistake install segments 75, 77 with the forward sides facing rearward. When installed, one end edge 83 inclines upwardly from forward end 83a to rearward end 83b, while the other inclines downward. The circumferential distance between forward ends 83a of end edges 83 is the same as the circumferential distance between the rearward ends 83b of end edges 83. If bearing insert 73, as shown in FIG. 8, rotates clockwise, forward end 83a of the end edge 83 on the right side leads the rearward end 83b, and forward end 83a of the end edge 83 on the left lags the rearward end 83b. The leading and trailing ends 83a, 83b of the end edges 83 serve to expel any debris that might accumulate around bearing insert 73 during operation. The gaps between end edges 83 of bearing insert segments 75, 77 facilitate injection molding of the segments. Furthermore, the angle of edges 83 reduce the chances of edges 83 snagging portions of strap 85 and cradle 67 as bearing insert 73 rotates because edges 83 are not normal to the direction of rotation.

Figure 9:
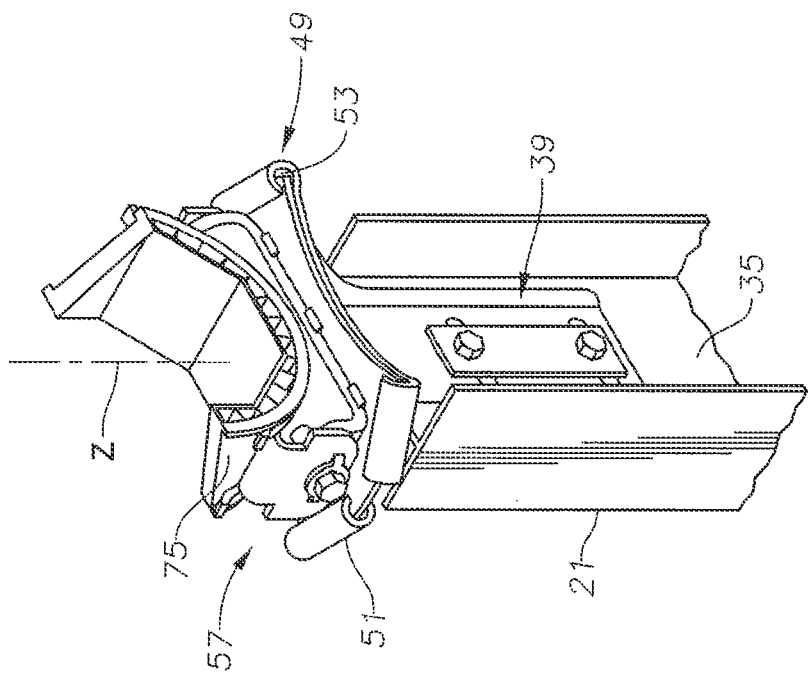
FIG. 9 is a perspective view of one of the segments of the bearing insert of FIG. 8 placed on the bearing saddle of FIG. 7.

FIG. 9 shows bearing insert segment 75 placed on cradle 67. The partially cylindrical outer surface of bearing insert segment 75 has the same diameter as the partially cylindrical surface of cradle 67, thus is in flush contact.

FIG. 10 shows torque tube 17 placed on segment 75. Torque tube 17 has a mating polygonal contour to bearing insert drive surfaces 78, which in this instance comprises octagonal flat surfaces 84. The worker then places bearing insert segment 77 over torque tube 17. Preferably, end edges 83 of segment 77 do not contact end edges 83 of segment 75, leaving gaps between them.

The worker then positions a clamp or strap 85 over bearing insert segment 77. Strap 85 is preferably metal, but it could be a polymer, and it has a cylindrical portion with the same diameter as the outer cylindrical surfaces of segments 77, 75. Strap 85 extends more than 180 degrees and has two straight depending ends 87. Strap ends 87 extend alongside and on the outer sides of cradle tabs 69. Each strap end 87 has a fastener slotted slotted hole 89 that aligns with fastener holes 91 and 93 in cradle tabs 69 and base tabs 65, respectively. Strap end fastener slotted hole 89 is preferably a downward-facing open-ended slot, thus it will slide over fastener 71. A nut attaches to the opposite end of fastener 71, which extends through holes 89, 91, 93 to secure strap 85 and cradle 67 to base 59.

As illustrated in FIG. 12, a washer 95 may be located between the head of fastener 71 and strap end 87. In this example, washer 95 has two inward-facing lugs 97 that enter mating apertures 99 in strap end 87. Apertures 99 are illustrated on opposite sides of strap end slotted hole 89. Washer lugs 97 extend into apertures 99 in strap ends 87 to retain strap 85 before fastener 71 is tightened. There are no mating apertures for washer lugs 97 in cradle tabs 69. The open ended holes 89 in strap ends 87 enable a worker to install strap 85 without removing fasteners 71, and washer lugs 97 facilitate the process. Washer 95 may also have several outward-facing protuberances 101, which are used ergonomically to assist a worker in manipulating washer 95 and do not enter any mating holes.

Figure 15:
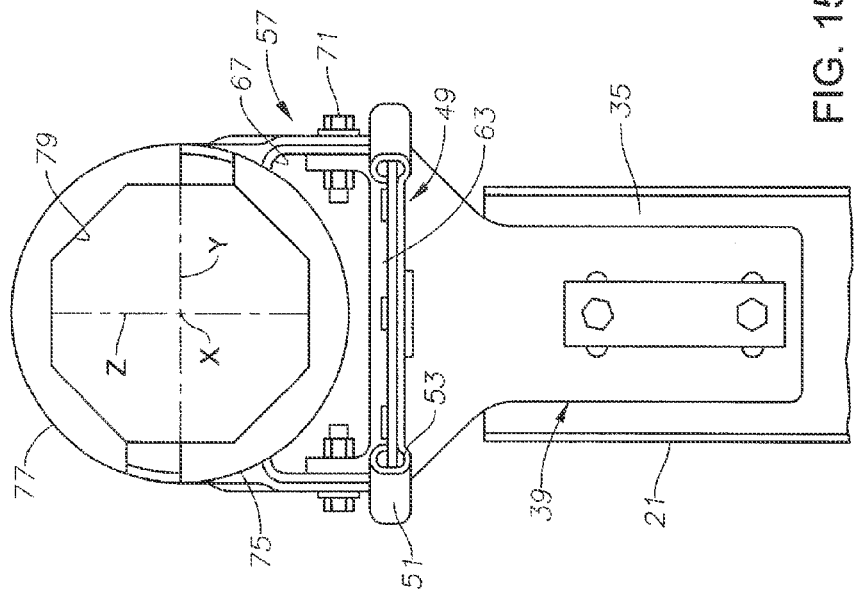
FIG. 15 is a front view of the assembled bearing of FIG. 14, with the torque tube removed.
Figure 14:
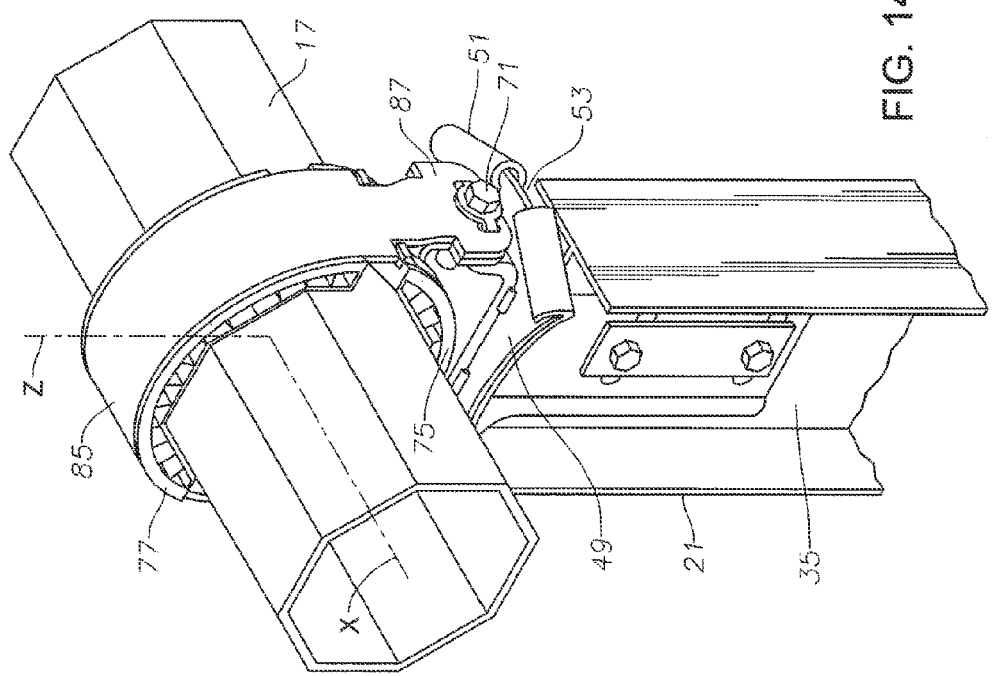
FIG. 14 is a perspective view of the bearing of FIG. 11, shown assembled in a centered position with its pitch axis horizontal and its yaw angle at zero.
Figure 17:
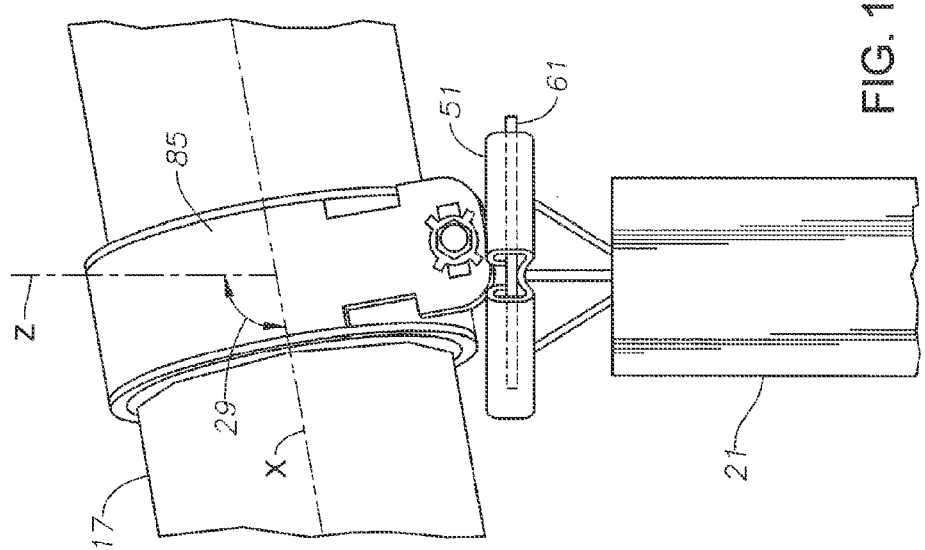
FIG. 17 is a side view of the assembly bearing of FIG. 14, with its pitch axis inclined relative to the vertical axis and its yaw angle being acute.
Figure 16:
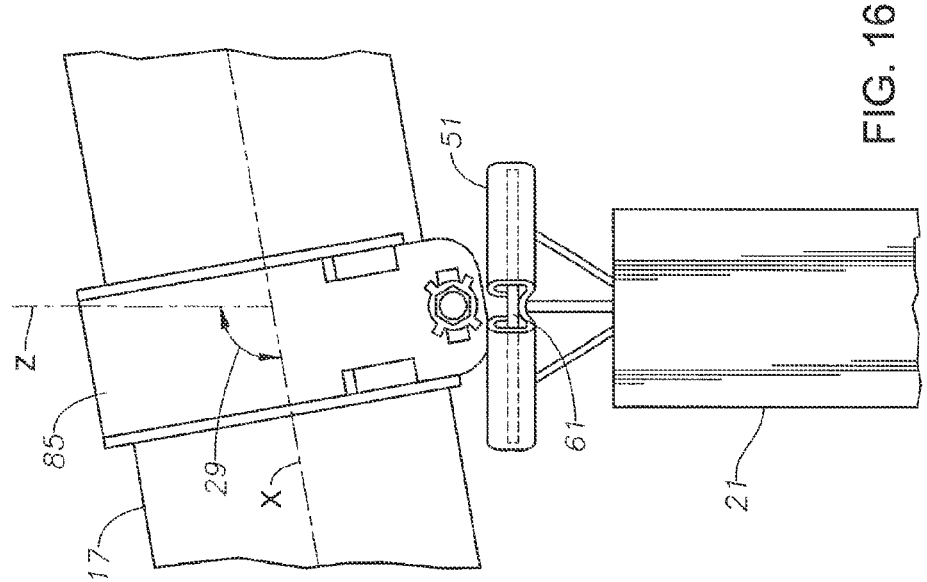
FIG. 16 is a side view of the assembled bearing of FIG. 14, with its pitch axis inclined relative to the vertical axis and in a centered position with its yaw angle at zero.

FIGS. 14 and 15 illustrates the assembled bearing 19 with the X-axis oriented in a horizontal plane perpendicular to the Z-axis and yaw angle 33 (FIG. 4) at zero. In FIGS. 16 and 17, the worker has adjusted fastener 71 to secure strap 85 and cradle 67 (FIG. 15) in an inclined position. The X-axis now is at a pitch angle of about 100 degrees relative to Z-axis, rather than 90 degrees as in FIGS. 14 and 15. In FIG. 16, the yaw angle is zero, with base lugs 61 centered in rolls 51, as indicated by the dotted lines. In FIG. 17, the yaw angle is greater than zero, and the centerline of base lugs 61 is offset from the center line of the small gap between rolls 51. In FIG. 17, the X-axis is skewed at a yaw angle relative to post face 35, rather than being normal as in FIG. 16.

During installation, posts 21 are embedded into terrain 27. Lower brackets 39 are rigidly secured to posts 21 in a desired alignment as shown in FIG. 5. Referring to FIGS. 6 and 7, the worker attaches bearing saddle 57 to bearing mount 49 using the twist-lock arrangement of base lugs 61 and roll slots 53. Preferably cradle 67 will be assembled with base 59, but fasteners 71 are not yet tight to allow cradle 67 to be free to pivot in inclined pitch directions relative to base 59. The worker will rotate bearing saddle 57 about the Z-axis until it is approximately centered on the fixed bearing mount 49, as shown in FIG. 7. At this point, bearing saddle 57 is still free to rotate about the Z-axis to allow yaw movement, and cradle 67 is still free to tilt forward and rearward to allow pitch changes. The worker then may place bearing insert segment 75 on cradle 67. Bearing insert segment 75 will simply rest on cradle 67 and not be secured at this time.

Figure 11:
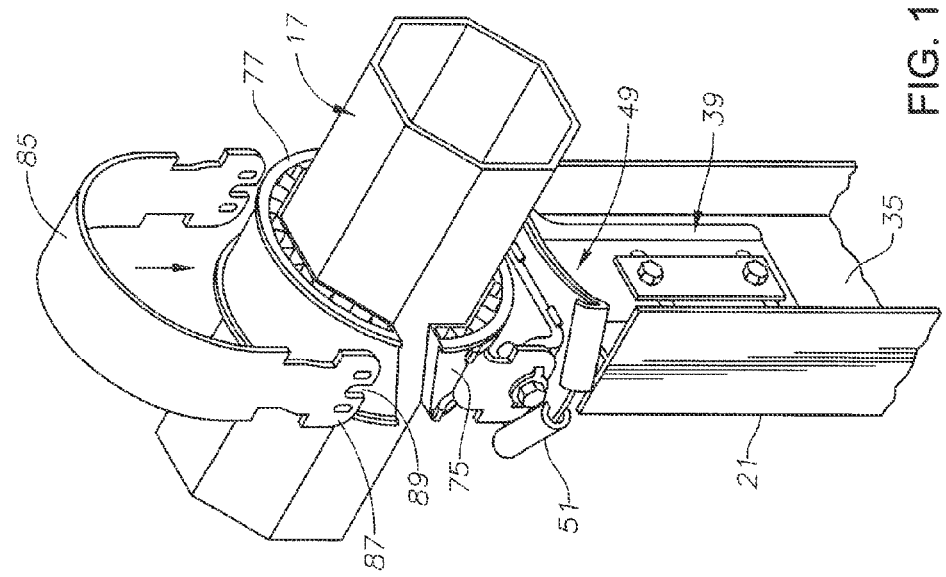
FIG. 11 is a perspective view similar to FIG. 10, but showing a strap or clamp being installed over the bearing insert of FIG. 8.

The worker will install bearing saddles 57 on all of the posts 21 designated to support one torque tube 17. The workers then lift torque tube 17 over the several bearing saddles 47 and lowers torque tube 17 simultaneously onto the bearing insert segments 75. When doing so, the stiffness of torque tube 17 will likely cause at least some tilting movement of cradles 67 to adjust the cradles to whatever pitch angle 29 (FIG. 16) exists due to uneven terrain 27 (FIG. 2). Also, some slight Z-axis rotation of at least some of the bearing saddles 57 relative to posts 21 will likely occur as torque tube 17 lands in place. The workers then install bearing insert segments 77 over torque tube 17, as shown in FIG. 11. The workers then place strap 85 over bearing insert segment 77, and align strap ends 87 with cradle tabs 69, as shown in FIGS. 11-13. Strap end holes 89 slide onto exposed portions of fasteners 71 and washer lugs 97 enter apertures 99. The workers secure fasteners 71, which locks cradle 67 in a desired pitch angle 29 (FIG. 16), which could be 90 degrees or horizontal, or the pitch angle could incline in upward or downward directions. The final rotational position of bearing saddle 57 on bearing mount 49 about the Z-axis preferably is not locked. That final rotational position could be with a zero yaw angle or an acute yaw angle 33 (FIG. 4). During operation, torque tube 21 rotates bearing inserts 73, which rotate in sliding engagement with straps 85 and cradles 67.

Over time, wear to bearings 19 occurs. Bearing insert 73 may be readily replaced by removing strap 85, then bearing insert segment 77 and replacing it.

The twist-lock arrangement allows the bearings to be quickly installed on the posts. The pitch and yaw compliancy provided by the bearing allows compliant adjustments in both pitch and yaw directions automatically as torque tube 21 is being placed on cradles 67.

While the disclosure has been shown in only one of its forms, it should be apparent that various modifications are possible. For example, slots 53 could alternately be on the bearing saddle 57 and lugs 61 on the bearing mount 49. Slots 53 could be formed otherwise than by rolls 51. A variety of twist-lock arrangements could be used instead of the one shown. The bearings could be employed in solar panel array systems other than those that daily track the sun. For example, the torque tube of a manually adjustable solar panel array system could be mounted on posts with bearings as described.

The invention claimed is:

1. A bearing for a torque tube of a solar panel array system, comprising:
    a lower bracket having a post mounting plate with apertures to receive fasteners to mount to a vertical post, the lower bracket having a bearing mount on an upper end of the post mounting plate, the bearing mount having a vertical Z-axis;
    a bearing saddle;
    a bearing insert that mounts on the bearing saddle and has a cavity for receiving the torque tube; and
    a twist-lock means between the bearing saddle and the bearing mount that secures the bearing saddle to the bearing mount against movement relative to the bearing mount along the Z-axis in response to incremental rotation of the bearing saddle relative to the bearing mount, but allows rotational movement of the bearing saddle relative to the bearing mount about the Z-axis after being completely secured to the bearing mount, to enable the bearing saddle to rotate and self-orient while the torque tube is being received in the bearing insert.

2. The bearing according to claim 1, wherein the twist-lock means comprises:
    slots on one of the bearing mount and the bearing saddle, the slots being spaced about the Z-axis; and
    lugs on the other of the bearing mount and the bearing saddle in sliding into engagement with the slots in response to rotation of the bearing saddle about the Z-axis relative to the bearing mount.

3. The bearing according to claim 1, wherein the bearing insert is rotatable about an X-axis relative to the bearing saddle after receiving the torque tube and being secured to the bearing saddle.

4. The bearing according to claim 1, wherein the twist-lock means comprises:
    slots on the bearing mount that are spaced around the Z-axis of the bearing mount; and
    lugs on the bearing saddle that slide into and are retained in the slots against movement along the Z-axis in response to rotation of the bearing saddle about the Z-axis relative to the bearing mount; and wherein
    the bearing mount and the bearing saddle are free of any structure that prevents rotation of the bearing saddle relative to the bearing mount about the Z-axis after the lugs have engaged the slots.

5. The bearing according to claim 1, wherein the bearing saddle comprises:
    a base;
    a cradle mounted to the base by fasteners, the cradle having an upward-facing cylindrical surface that extends less than 360 degrees;
    the bearing insert being secured on the cradle, the bearing insert having a fully cylindrical outer surface that is rotatable on the cylindrical surface of the cradle after being secured to the cradle, and wherein the cavity of the bearing insert is polygonal for mating and rotating with the torque tube; and
    wherein the cradle is tiltable and adjustable relative to the base to set a pitch angle relative to the Z-axis for an X-axis of the cavity of the bearing insert.

6. The bearing according to claim 1, wherein the bearing saddle comprises:
    a base having a pair of upward extending base tabs, each of the base tabs having a hole;
    a cradle terminating in two upper ends;
    the cradle having a pair of cradle tabs, each of the cradle tabs extending downward from one of the upper ends each of the cradle tabs having a hole, the cradle being juxtaposed with the base tabs such that the holes of the cradle tabs align with the holes of the base tabs;
    fasteners extending through the aligned holes of the base tabs and the cradle tabs to secure the cradle to the base, the fasteners having a retaining position that retains the cradle on the base and allows the cradle to be adjustably tilted relative to the base to selected pitch angles relative to the Z-axis prior to fully tightening the fasteners; and
    a strap that fits over the bearing insert and has strap tabs on each end, the strap tabs having slotted holes with open lower ends that register with the holes of the base tabs and the cradle tabs and slide over the fasteners while the fasteners are in the retaining position, and wherein fully tightening the fasteners secures the strap over the bearing insert.

7. The bearing according to claim 6, wherein the cradle comprises an upward facing cylindrical surface and the bearing insert comprises:
    a pair of segments, each having an inner polygonal surface for mating with a polygonal exterior on the torque tube, each having an outer cylindrical surface that slidingly engages and rotates on the cylindrical surface of the cradle.

8. The bearing according to claim 1, wherein:
    the bearing mount comprises an upward-facing surface, the Z-axis being normal to the upward-facing surface;
    the bearing saddle comprises a downward-facing surface that overlies and slidingly engages the upward-facing surface when the bearing saddle is rotated relative to the bearing mount; and the twist-lock means comprises:
    at least two rolls integrally formed on opposite edges of one of the surfaces relative to the Z-axis, the rolls having lips vertically spaced from said one of the surfaces to define slots 53; and
    lugs formed on opposite edges of the other of the surfaces, each of the slots having an open entry end to receive one of the lugs during rotation of the bearing saddle about the Z-axis relative to the bearing mount.

9. The bearing according to claim 7, wherein:
    each of the segments of the bearing insert has two end edges, the end edges of one of the segments being juxtaposed with the end edges of the other segments when the segments are positioned around the torque tube; and
    wherein each of the end edges extends along a line that is at an acute angle relative to an X-axis of the cavity.

10. A solar panel array system comprising:
    a plurality of posts for mounting vertically in earth, each of the posts having a Z-axis;
    a torque tube extending along an X-axis at upper ends of the posts for supporting and tilting solar panels;

a bearing mounted to each the posts to support the torque tube and allow rotation of the torque tube about the X-axis, each of the bearings comprising:
an upward-facing surface on an upper end of each of the posts;
a bearing saddle base having a downward-facing surface;
a plurality of lugs on one of the surfaces and a plurality of mating slots on the other of the surfaces, such that rotating the base about the Z-axis relative to the upward-facing surface causes the lugs to enter the slots;
a bearing saddle cradle, the cradle being adjustably mounted to the base at selected pitch angles relative to the base to allow the X-axis of the torque tube be at pitch angles other than 90 degrees relative to the Z-axis;
a bearing insert that mounts on the cradle and has a cavity through which the torque tube extends; and
wherein the upward-facing surface and the base are free of any structure that limits rotation of the base after the lugs have engaged the slots, enabling the bearing saddle to rotate about the Z-axis relative to the upward-facing surface and self-orient when the torque tube is installed on each the posts.

11. The system according to claim 10, wherein:
the bearing insert has a polygonal interior that mates with and rotates with the torque tube and a cylindrical exterior that slidingly while the torque tube rotates.

12. The system according to claim 10, further comprising:
rolls formed on a periphery of one of the surfaces, each of the rolls having a lip vertically spaced from and facing said one of the surfaces to define one of the slots.

13. The system according to claim 10, further comprising:
rolls formed on a periphery of one of the surfaces, each of the rolls having a lip vertically spaced from and facing said one of the surfaces to define one of the slots, each of the slots having an entry to receive one of the lugs; and wherein
each of the rolls is formed along a straight line tangent to a circle that passes through all of the slots.

14. The system according to claim 10, further comprising:
upward-extending base tabs on the base, the base tabs having holes therethrough;
downward-extending cradle tabs on the cradle that extend alongside the base tabs and have holes that align with the holes in the cradle tabs;
fasteners that extend through the holes of the base tabs and the holes of the cradle tabs to secure the cradle to the base, the fasteners having a retaining position prior to being fully tightened that enables the cradle to be adjustably tilted at a selected pitch angle relative to the base prior to fully tightening;
a strap that extends over the bearing insert and has slotted holes that align with the holes in the base tabs and the cradle tabs, the slotted holes having open lower ends that slide over the fasteners while in the retaining position; and
wherein tightening the fasteners from the retaining position secures the strap and the cradle to the base.

15. The system according to claim 10, wherein each of the bearing assemblies further comprises:

a mounting plate that extends alongside and is secured to the post, the upward-facing surface being formed on the mounting plate;
the slots are formed in side edges of the upward-facing surface; and
the lugs are formed on peripheral edges of the base.

16. The system according to claim 10, wherein:
each of the posts has a flat face; and
when the X-axis is at a yaw angle, the X-axis will be at an angle other than 90 degrees relative to the face.

17. The system according to claim 10, further comprising:
upward-extending base tabs on the base, the base tabs having holes therethrough;
downward-extending cradle tabs on the cradle that extend alongside the base tabs and have holes that align with the holes in the cradle tabs;
a strap that extends over the bearing insert and has slotted holes that align with the holes in the base tabs and the cradle tabs;
fasteners that extend through the holes of the base tabs, the cradle tabs and the strap ends when aligned to secure the strap and the cradle to the base; and
a washer located between a head of each of the fasteners and one of the strap ends, the washer having inward-facing protuberances that enter mating apertures provided in the strap end to retain the strap end with the washer.

18. A method of mounting a solar panel array, comprising:
(a) installing a plurality of posts, each of the posts extending upward along a Z-axis;
(b) providing a bearing mount on an upper end of each of the posts and a separate bearing saddle, the bearing mount and the bearing saddle having a mating twist-lock arrangement;
(c) placing the bearing saddle on the bearing mount and rotating the bearing saddle an increment about the Z-axis, causing the twist-lock arrangement to secure the bearing saddle to the bearing mount against movement along the Z-axis but allow free rotation of the bearing saddle about the Z-axis; and
(d) placing a bearing insert around the torque tube and placing the torque tube on the bearing saddle after the bearing saddle has been secured to the bearing mount, allowing the bearing saddle to rotate about the Z-axis relative to the bearing mount to self orient relative to an X-axis of the torque tube, and securing the bearing insert to the bearing saddle.

19. The method according to claim 18, wherein step (d) further comprises:
rotating the bearing saddle past 90 degrees relative to a face of the post to skew the X-axis at a selected yaw angle relative to a face of the post.

20. The method according to claim 18, wherein:
step (b) further comprises providing the saddle with a base and a cradle; and
step (c) further comprises adjusting an inclination of the cradle relative to the base to select a pitch angle relative to the Z-axis for the X-axis.

* * * * *